US008697459B2

(12) United States Patent
Adachi et al.

(10) Patent No.: US 8,697,459 B2
(45) Date of Patent: Apr. 15, 2014

(54) SURFACE EMITTING LASER MODULE, OPTICAL SCANNER, AND IMAGE FORMING APPARATUS

(75) Inventors: Kazuhiko Adachi, Miyagi (JP); Takayuki Yamaguchi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 126 days.

(21) Appl. No.: 13/048,421

(22) Filed: Mar. 15, 2011

(65) Prior Publication Data

US 2011/0228033 A1   Sep. 22, 2011

(30) Foreign Application Priority Data

Mar. 17, 2010   (JP) .................................. 2010-061648
Jan. 5, 2011    (JP) .................................. 2011-000775

(51) Int. Cl.
*B41J 2/385*   (2006.01)
*G02B 26/08*   (2006.01)
*H01S 5/00*    (2006.01)
*H01L 21/00*   (2006.01)

(52) U.S. Cl.
USPC ..... 438/28; 347/130; 372/50.124; 359/204.1; 438/26; 438/106

(58) Field of Classification Search
USPC ................... 347/130; 359/204.1; 372/50.124; 438/26, 28, 106
See application file for complete search history.

(56) References Cited

U.S. PATENT DOCUMENTS

| | | | | |
|---|---|---|---|---|
| 5,527,992 A | * | 6/1996 | Terajima | 174/551 |
| 5,771,254 A | * | 6/1998 | Baldwin et al. | 372/31 |
| 5,949,654 A | * | 9/1999 | Fukuoka | 361/760 |
| 6,567,435 B1 | * | 5/2003 | Scott et al. | 372/29.021 |
| 6,940,885 B1 | * | 9/2005 | Cheng et al. | 372/50.1 |
| 2004/0026757 A1 | * | 2/2004 | Crane et al. | 257/434 |
| 2004/0206535 A1 | * | 10/2004 | Fukushima | 174/52.3 |
| 2005/0214979 A1 | * | 9/2005 | Suzuki et al. | 438/118 |
| 2006/0162104 A1 | * | 7/2006 | Malone et al. | 15/97.1 |
| 2009/0296762 A1 | * | 12/2009 | Yamaguchi | 372/34 |
| 2010/0013084 A1 | * | 1/2010 | Medeiros, III | 257/693 |

FOREIGN PATENT DOCUMENTS

JP   2007-103576   4/2007

* cited by examiner

*Primary Examiner* — Alessandro Amari
*Assistant Examiner* — Kendrick Liu
(74) *Attorney, Agent, or Firm* — Cooper & Dunham LLP

(57) ABSTRACT

Disclosed is a surface emitting laser module including a surface emitting laser element formed in a semiconductor substrate and having a surface emitting laser array that emits light in a direction perpendicular to a surface of the semiconductor substrate; a package having a region in which the semiconductor substrate is provided; and a metal cap having a cylindrical part formed of metal, the cylindrical part having a transparent substrate on one side thereof and a bottom part on the other side thereof bonded to the package. The transparent substrate is provided in the metal cap in such a manner as to be inclined with respect to the semiconductor substrate, the package has a metal part at a bonding part thereof bonded to the metal cap, and the metal part and the metal cap are bonded together by welding.

17 Claims, 14 Drawing Sheets

FIG.1
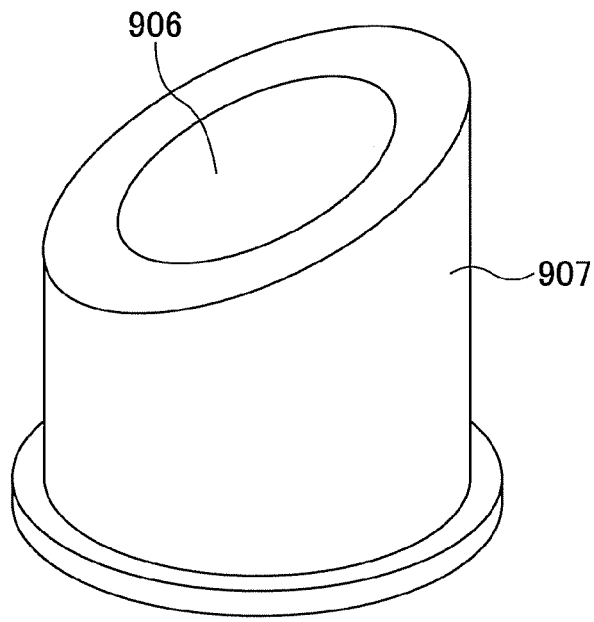
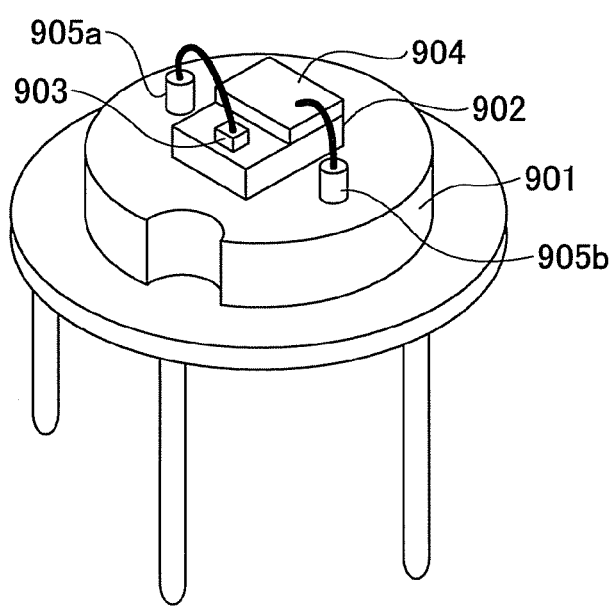

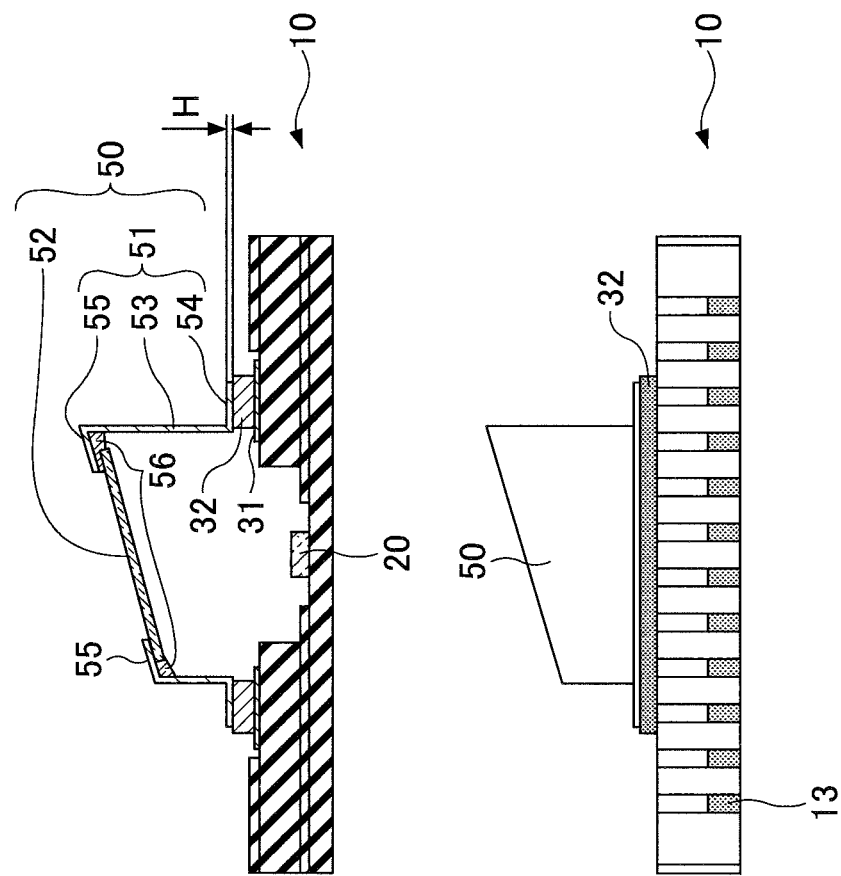

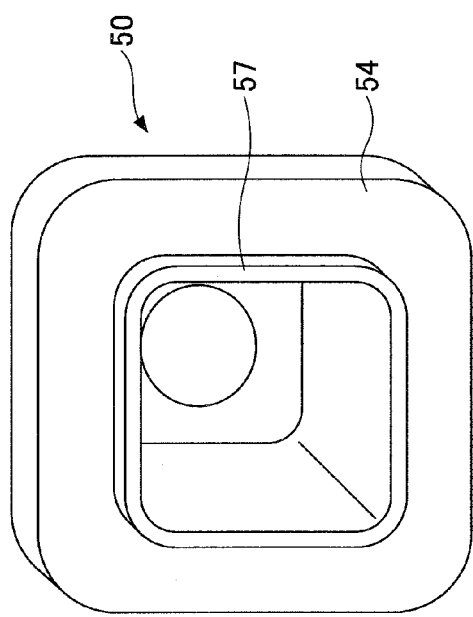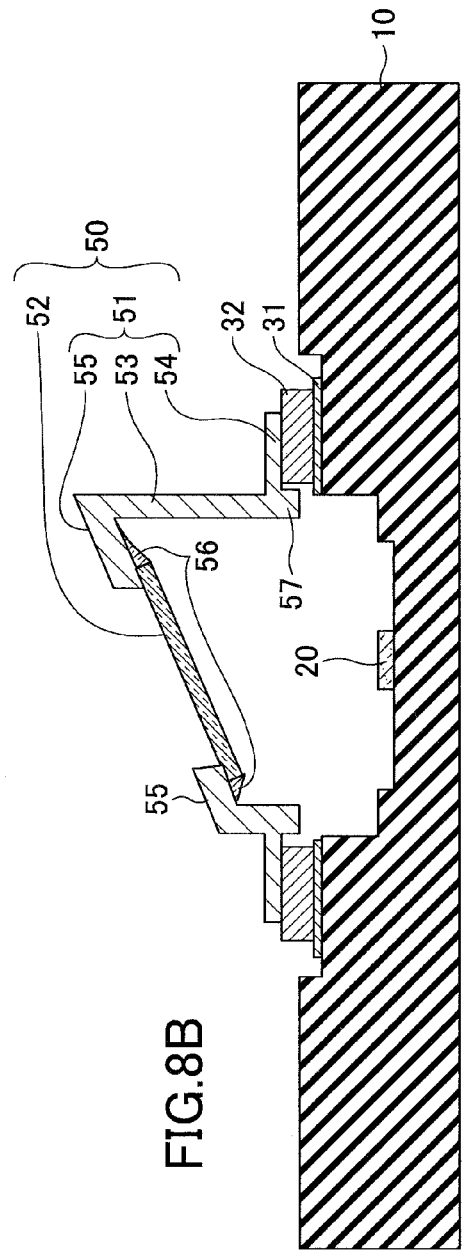
FIG.8A
FIG.8B

SURFACE EMITTING LASER MODULE, OPTICAL SCANNER, AND IMAGE FORMING APPARATUS

BACKGROUND OF THE INVENTION

1. Field of the Invention

The present invention relates to a surface emitting laser module, an optical scanner, and an image forming apparatus.

2. Description of the Related Art

A VCSEL (Vertical Cavity Surface Emitting LASER) is a semiconductor laser that emits light in a direction perpendicular to a substrate and has characteristics in that it can be manufactured at low cost compared with an end-surface emitting laser and can be easily arrayed. Therefore, it has been studied that the VCSEL is used as a light source for an optical communication such as an optical interconnection, a light source for an optical pickup, a light source of an image forming apparatus such as a laser printer, or the like. Further, the VCSEL has been proceeding toward practical utilization in some fields.

Meanwhile, an optical system, which generally has a semiconductor laser element or the like including a surface emitting laser element, has a problem in that a light amount fluctuates due to return light produced when reflection light from a lens or the window glass of a package returns to the original laser element. The fluctuation of the light amount occurs in various ways; the light amount fluctuates at a high speed of a nsec order or fluctuates at a msec order depending on the situations. Up until now, it has been assumed that the VCSEL is free from return light because it has high mirror reflectance. However, it has been confirmed as a result of a study that the VCSEL is not necessarily free from return light. Particularly, in the case of a surface emitting laser array in which plural surface emitting lasers are arranged, light emitted from one of the surface emitting lasers turns into return light and the return light is incident on an adjacent one of the surface emitting lasers, which results in the fluctuation of a light amount.

In order to address the problem due to return light, there is a method of forming a reflection preventing film on the window glass of a package. However, even if the reflection preventing film is formed to set the transmissivity of light at 99.5% or more, reflectance cannot be completely reduced to zero. Therefore, the problem due to return light cannot be totally solved.

Further, Patent Document 1 discloses another method for addressing the problem. According to this method, as shown in FIG. 1, a window glass arranged on the side of the light emitting surface of a laser element is inclined with respect to the light emitting surface. Specifically, a sub-mount 902 is provided on a metal stem 901, and a surface emitting laser chip 903 is provided on the sub-mount 902 together with a monitoring photo detector 904. The surface emitting laser chip 903 and the monitoring photo detector 904 are electrically connected to pins 905a and 905b, respectively, by wire bonding or the like. A metal cap 907 having a transparent window glass 906 through which light is emitted from the surface emitting laser chip 903 is mounted on the metal stem 901, and the metal cap 907 is bonded to the metal stem 901 by welding. Note that the window glass 906 is attached to the metal cap 907 in a state of being inclined with respect to the front surface of the surface emitting laser chip 903. Accordingly, although the light emitted from the surface emitting laser of the surface emitting laser chip 903 is reflected by the window glass 906, it never returns to the surface emitting laser because the window glass 906 is inclined with respect to the front surface of the surface emitting laser chip 903. As a result, the problem due to return light is not caused.

However, the method disclosed in Patent Document 1 is not appropriate because a number of electrodes are required and a metal stem and a metal cap are upsized in a case where a surface emitting laser array in which plural surface emitting lasers are formed is mounted. Moreover, since a surface emitting laser array requires a large area to emit light, a large glass substrate or the like must be used as a window glass. Therefore, the method disclosed in Patent Document 1 is not adapted to the surface emitting laser array. Furthermore, in terms of reliability, a surface emitting laser module in which a surface emitting laser array is packaged in an air-tight state has been demanded.

Patent Document 1: JP-A-2007-103576

SUMMARY OF THE INVENTION

Accordingly, the present invention may have an object of providing a surface emitting laser module on which a surface emitting laser array is mounted, wherein the surface emitting laser module has a structure that produces less return light and enables a cap to be reliably attached in an air-tight state; an optical scanner using the surface emitting laser module; and an image forming apparatus.

According to an embodiment of the present invention, there is provided a surface emitting laser module including a surface emitting laser element formed in a semiconductor substrate and having a surface emitting laser array that emits light in a direction perpendicular to a surface of the semiconductor substrate; a package having a region in which the semiconductor substrate is provided; and a metal cap having a cylindrical part formed of metal, the cylindrical part having a transparent substrate on one side thereof and a bottom part on the other side thereof bonded to the package. The transparent substrate is provided in the metal cap in such a manner as to be inclined with respect to the semiconductor substrate, the package has a metal part at a bonding part thereof bonded to the metal cap, and the metal part and the metal cap are bonded together by welding.

Other objects, features and advantages of the present invention will become more apparent from the following detailed description when read in conjunction with the accompanying drawings.

BRIEF DESCRIPTION OF THE DRAWINGS

FIG. 1 is a view showing the structure of a conventional surface emitting laser module;

FIGS. 3A and 3B are views showing the structure of a surface emitting laser module according to the first embodiment;

FIGS. 8A and 8B are views for explaining the surface emitting laser module according to a third embodiment;

DETAILED DESCRIPTION OF THE PREFERRED EMBODIMENTS

Embodiments of the present invention are described below. Note that the same components and the like are denoted by the same reference symbols and their duplicated descriptions are omitted.

First Embodiment

A surface emitting laser module according to a first embodiment is described. The surface emitting laser module according to this embodiment uses a surface emitting laser array chip in which plural, e.g., 32 or 40 surface emitting lasers are formed. Since such a surface emitting laser array chip has numerous terminals, it is really difficult for the chip to be mounted on a so-called can package. On the other hand, for such a surface emitting laser array chip, there has been used a ceramic package enabling plane mounting and having a concave part with which an electrode terminal as a lead wire is easily extracted. Specifically, the surface emitting laser array chip is provided at the bottom surface (bottom surface of a cavity) of the concave part of the ceramic package and is configured to bond a window glass to the uppermost surface or the like of the ceramic package. In this configuration of the surface emitting laser array chip, it is preferable that the window glass be inclined because return light often occurs if the window glass is provided in a direction perpendicular to light emitted from the surface emitting lasers.

Meanwhile, the ceramic package is an insulator formed of ceramics. Therefore, it is really difficult to attach a metal cap having the window glass to the ceramic package in an air-tight state without using a resin material such as an adhesive.

This embodiment is directed to the above points and provides, without using a resin material such as an adhesive, the surface emitting laser module configured to be attached to a ceramic package, on which a surface emitting laser array chip is mounted, in an air-tight state with a window glass inclined.

(Surface Emitting Laser Module)

Figure 2A:
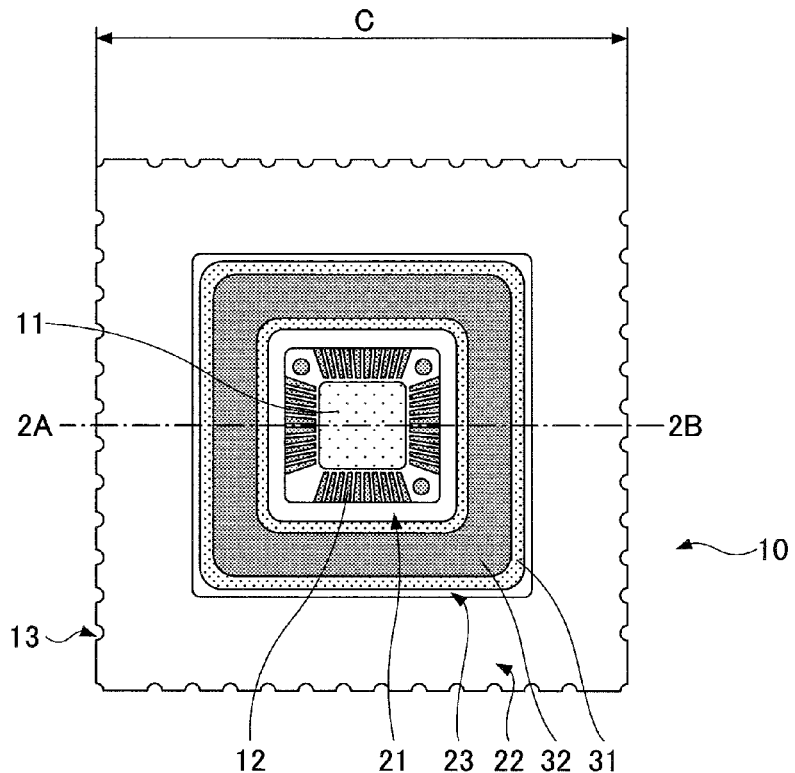
FIGS. 2A through 2C are views showing the structure of a package according to a first embodiment.
Figure 2B:
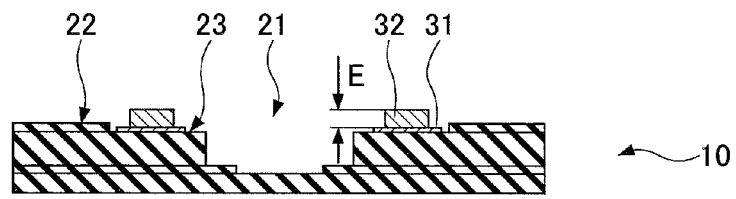
Figure 2C:
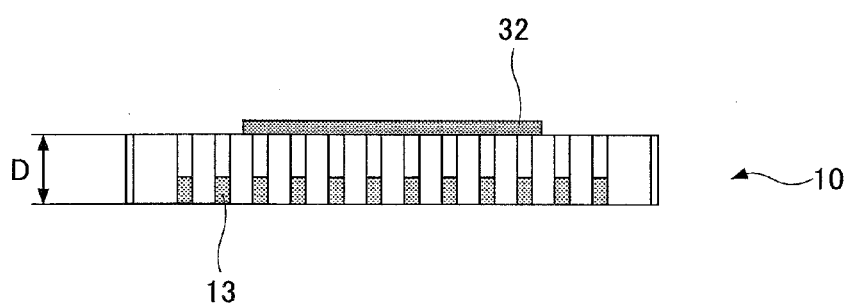
Figure 4:
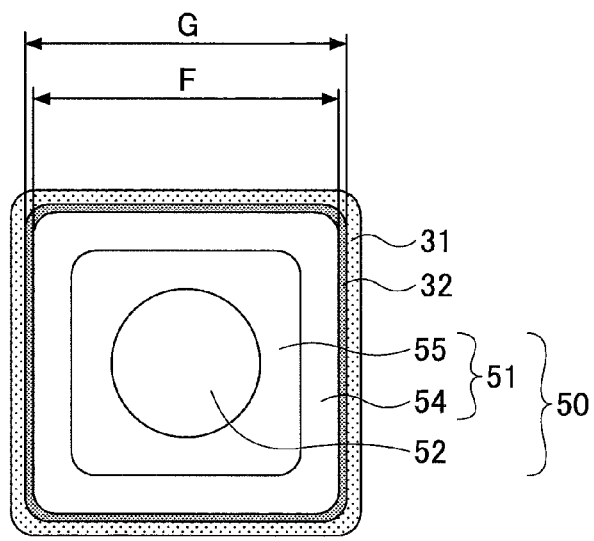
FIG. 4 is a view for explaining a metal cap according to the first embodiment.
Figure 5:
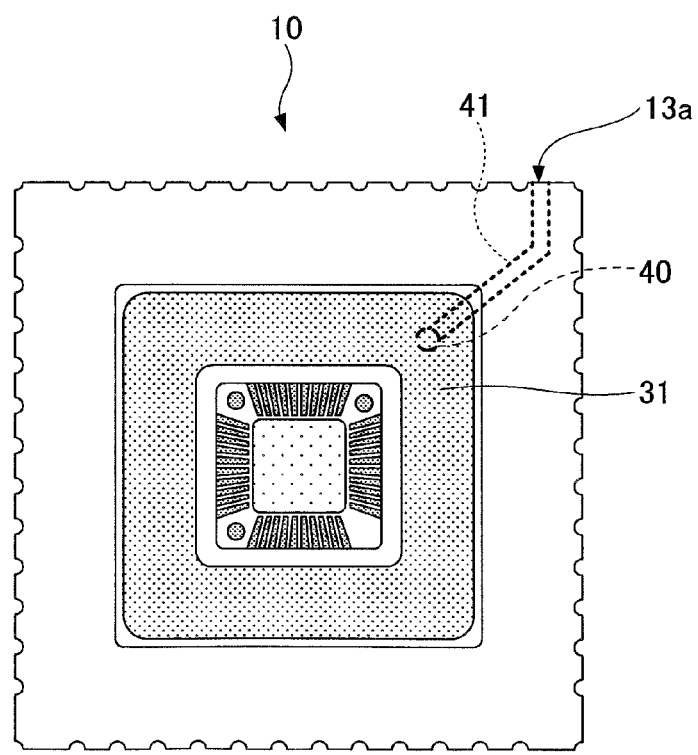
FIG. 5 is a view for explaining the surface emitting laser module according to the first embodiment.

The surface emitting laser module according to this embodiment is described based on FIGS. 2A-2C through FIG. 4. FIGS. 2A through 2C show a package, wherein FIG. 2A is a top view, FIG. 2B is a cross-sectional view taken along dashed line 2A-2B of FIG. 2A, and FIG. 2C is a side view. FIGS. 3A and 3B show the surface emitting laser module in which a metal cap is attached to the package, i.e., the surface emitting laser module according to this embodiment, wherein FIG. 3A is a cross-sectional view and FIG. 3B is a side view. FIG. 4 is a top view of a region including the metal cap.

The package 10 is formed of ceramics having a concave part and can mount a surface emitting laser array chip 20 for 40 channels as a surface emitting laser element as shown in FIG. 3A. The package 10 is formed into a square having a side C of about 14.2 mm and a thickness D of 1.88 mm. The package 10 has a mount part 11 at the bottom surface of the concave part to mount the surface emitting laser array chip 20 and has plural lead terminals 12 radially extending around the mount part 11. Note that the concave part of the package 10 is also called a cavity region 21. Further, 48 connection terminals (castellations) 13 are provided around the package 10 to connect the surface emitting laser module to a print substrate or the like, which in turn establishes an electrical connection with the lead terminals 12 provided inside the concave part of the package 10. Note that 40 out of the 48 connection terminals 13 are electrically connected to a surface emitting laser array while the remaining 8 connection terminals 13 are electrically connected to the mount part 11 to serve as the cathode electrodes of surface emitting lasers.

A gold plating part 31 is formed at a step part 23 one step below an uppermost surface 22 of the package 10. On the gold plating part 31 is provided a substantially-square metal ring 32 having an opening part formed to surround the cavity region 21. The metal ring 32 is formed of kovar (mainly consisting of Ni, Co, and Fe) having a thermal expansion coefficient close to ceramics as the material forming the package 10 and coated with gold at its front surface. The metal ring 32 is fixed to the gold plating part 31 by silver solder (not shown).

In this embodiment, the metal ring 32 has a thickness E of 0.5 mm, and a step height between the step part 23 where the metal ring 32 is attached and the uppermost surface 22 is 0.2 mm. Therefore, The metal ring 32 is formed in such a manner as to protrude from the uppermost surface 22 by about 0.3 mm. Note that the gold plating part 31 where the metal ring 32 is fixed has a thickness of about 1 μm. The metal ring 32 has a thickness only for ensuring its rigidity, and the thickness E is preferably in the range of about 0.3 mm through 1 mm.

Further, the gold plating part 31 is formed by electrolytic plating. In other words, the gold plating part 31 formed by electrolytic plating that provides higher adhesiveness than nonelectrolytic plating further increases its air tightness in a manufactured surface emitting laser module. In order to form the gold plating part 31 by electrolytic plating, a via hole 40 is formed below the gold plating part 31 to be connected to an internal wiring 41. Here, one end 13*a* of the internal wiring 41 extends to the side surface of the package 10 in an exposed state.

Specifically, a plating electrode formed of tungsten is formed in a region where the gold plating part 31 is formed in the package 10, and the via hole 40 is formed in a region formed of ceramics in the package 10 and electrically connected to the plating electrode of the embedded tungsten. Meanwhile, the tungsten in the via hole 40 extends up to the one end 13*a* of the internal wiring 41 formed of tungsten and formed in the package 10, and is exposed at the side surface of the package 10. Thus, in the predetermined region of the package 10 as an insulator, i.e., the region where the tungsten plating electrode is formed, gold plating can be applied by electrolytic plating to form the gold plating part 31.

Next, a metal cap 50 is described. The metal cap 50 has a cap main body part 51 formed of metal and a window glass 52 that causes light to pass through. The cap main body part 51 has a cylindrical part 53 formed into a cylinder, and the cylindrical part 53 has on one side a bottom part 54 folded into a planar shape to be connected to the metal ring 32. Further, the cylindrical part 53 has on the other side an inclination part to enable the window glass 52 to be attached to the cap main body part 51 at a predetermine angle. Thus, the window glass 52 is attached to the cap main body part 51 in such a manner as to be inclined at the predetermined angle with respect to a surface perpendicular to light emitted from the surface emitting laser of the surface emitting laser array chip 20. Note that the window glass 52 is fixed to the inclination part 55 of the cap main body part 51 from the inside of the cap main body part 51 by low-melting glass 56. Further, the predetermined angle at which the window glass 52 is attached to the cap main body part 51 is about 15 degrees.

Further, the metal cap 50 is formed such that the bottom part 54 of the cap main body part 51 has a length F smaller than the length G of the metal ring 32. Moreover, the metal cap 50 is formed such that a difference between the length F of the bottom part 54 and the length G of the metal ring 32 is about twice as large as a thickness H of the bottom part 54 of the metal cap 50. In other words, the metal cap 50 is formed in such a manner as to meet the following formula (1).

$$G - F \approx 2H \tag{1}$$

Figure 6B:
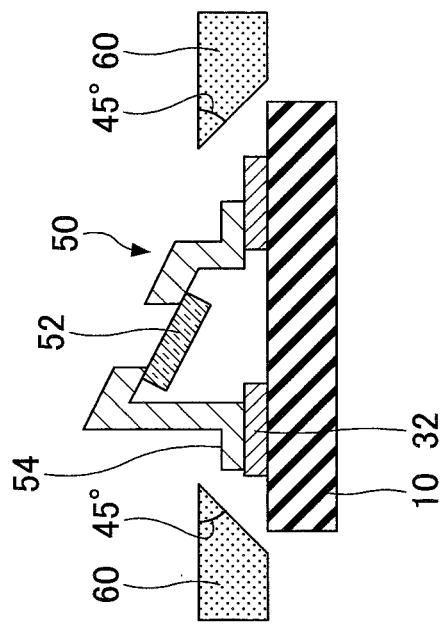
FIGS. 6A through 6D are views for explaining the surface emitting laser module according to the first embodiment.
Figure 6A:
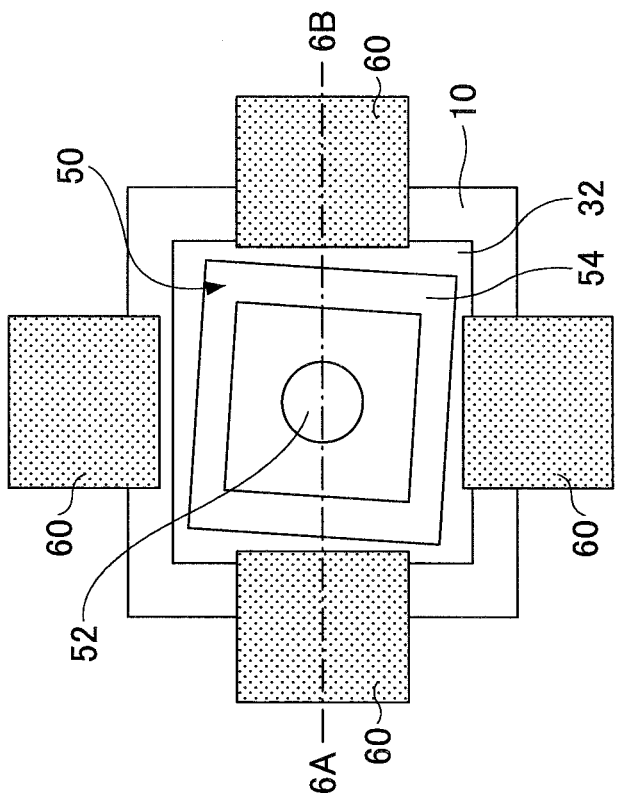
Figure 6D:
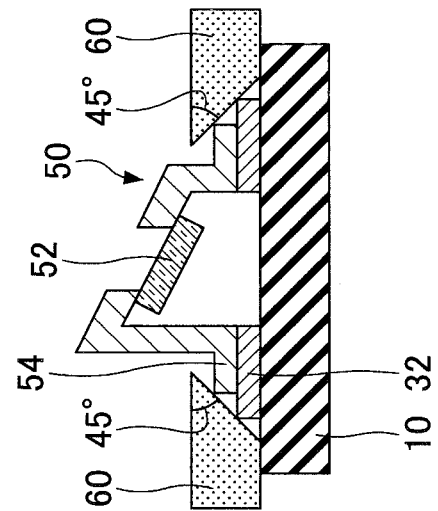
Figure 6C:
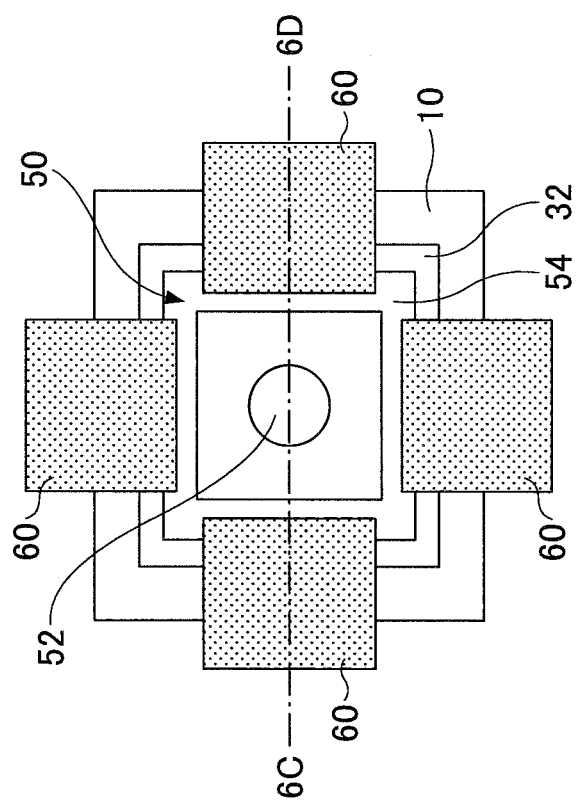

It the metal ring 32 and the metal cap 50 are formed in the above manner, they can be easily aligned with each other on the package 10. For example, as shown in FIGS. 6A through 6E, the metal ring 32 and the metal cap 50 can be easily aligned with each other by four attachment jigs 60 having an inclination of 45 degrees. Specifically, as shown in FIGS. 6A and 6B, the metal cap 50 is provided on the metal ring 32, and the attachment jigs 60 are arranged in all the directions of the metal cap 50. Then, as shown in FIGS. 6C and 6D, the metal cap 50 and the metal ring 32 can be aligned with each other when the attachment jigs 60 are moved closer to the metal cap 50 from all the directions. In other words, the metal cap 50 and the metal ring 32 can be aligned with each other such that an interval between the metal ring 32 and the bottom part 54 of the metal cap 50 is approximately the same in length as the thickness H of the bottom part 54. Note that FIGS. 6A and 6B show a state before the metal cap 50 and the metal ring 32 are aligned with each other by the attachment jigs 60, wherein FIG. 6A is a top view and FIG. 6B is a cross-sectional view taken along broken line 6A-6b of FIG. 6A. FIGS. 6C and 6D show a state after the metal cap 50 and the metal ring 32 are aligned with each other by the attachment jigs 60, wherein FIG. 6C is a top view and FIG. 6D is a cross-sectional view taken along broken line 6C-6D of FIG. 6C. FIGS. 6A through 6D explain the conception of the alignment between the metal cap 50 and the metal ring 32 and show the package 10 and the metal cap 50 in a simplified manner.

Then, the metal ring 32 and the cap main body part 51 of the metal cap 50 are welded together according to seam welding, thereby making it possible to obtain the surface emitting laser module in an air-tight state.

Second Embodiment

Figure 7:
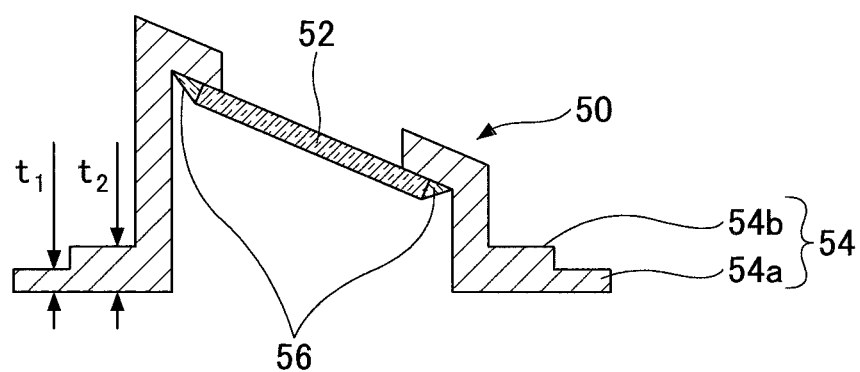
FIG. 7 is a view for explaining the surface emitting laser module according to a second embodiment.

Next, a second embodiment is described. In the second embodiment, the surface emitting laser module is formed such that the bottom part 54 of the metal cap 50 has two step parts. Specifically, as shown in FIG. 7, the bottom part 54 of the metal cap 50 according to this embodiment has a first bottom part 54a having a thickness $t_1$ formed on its outer side and a second bottom part 54b having a thickness $t_2$ formed on its inner side. Note that the thickness $t_2$ of the second bottom part 54 is formed to be greater than the thickness $t_1$ of the first bottom part 54a. The metal cap 50 per se is preferably formed to be thick in whole so as not to be easily deformed and so as to ensure its mechanical strength. However, if the bottom part 54 of the metal cap 50 is formed to be excessively thick, heat capacity generated when the metal cap 50 is welded to the metal ring 32 becomes large and thus the metal cap 50 is not adequate to welding. Accordingly, the metal cap 50 can ensure its sufficient mechanical strength without having an influence on finish by seam welding.

Note that details of the surface emitting laser module other than the above are the same as those of the first embodiment.

Third Embodiment

Next, a third embodiment is described. FIGS. 8A and 8B are views for explaining this embodiment, wherein FIG. 8A is a perspective view of the metal cap 50 used in the surface emitting laser module according to this embodiment and FIG. 8B is a cross-sectional view of the surface emitting laser module according to this embodiment. In this embodiment, the surface emitting laser module is formed such that the metal cap 50 has a convex part 57 provided on the side connected to the package 10 as the rear surface of the bottom part 54 of the metal cap 50. Specifically, the convex part 57 is formed such that a part substantially similar in shape to the inner part of the cylindrical part 53 of the metal cap 50 is formed at the inner periphery of the bottom part 54 so as to protrude from the rear surface of the bottom part 54 of the metal cap 50. The outer surface of the convex part 57 thus formed is smaller than the inner surface of the metal ring 32. In other words, the convex part 57 is formed in a region narrower than the inner part of the metal ring 32. Accordingly, when the metal cap 50 is provided on the package 10 with the convex part 57 positioned on the inner side of the metal ring 32, the metal ring 32 and the metal cap 50 can be easily aligned with each other. The protrusion parts 58 can be easily formed at the time of manufacturing the metal cap 50 by press working.

Note that details of the surface emitting laser module other than the above are the same as those of the first embodiment.

Fourth Embodiment

Figure 9A:
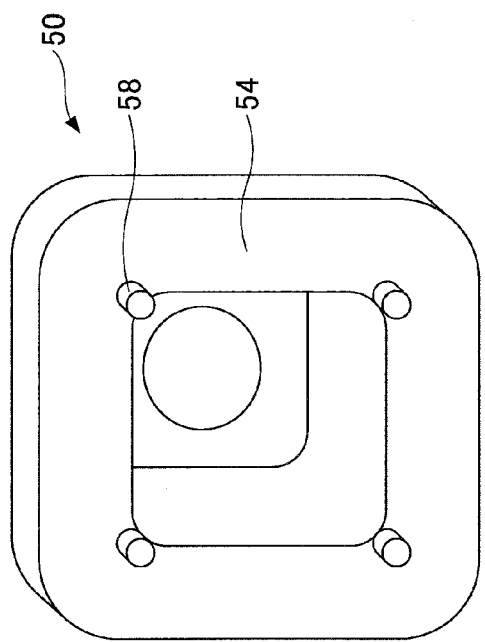
FIGS. 9A and 9B are views for explaining the surface emitting laser module according to a fourth embodiment.
Figure 9B:
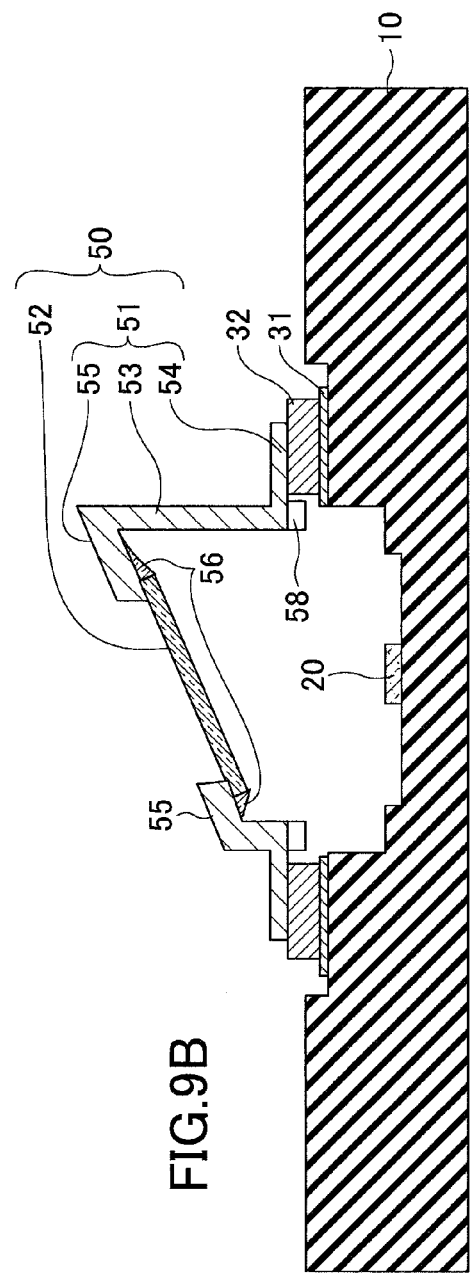

Next, a fourth embodiment is described. FIGS. 9A and 9B are views for explaining this embodiment, wherein FIG. 9A is a perspective view of the metal cap 50 used in the surface emitting laser module according to this embodiment and FIG. 9B is a cross-sectional view of the surface emitting laser module according to this embodiment. In this embodiment, the surface emitting laser module is formed such that the metal cap 50 has protrusion parts 58 provided on the side connected to the package 10 as the rear surface of the bottom part 54 of the metal cap 50. Specifically, the protrusion parts 58 are formed at the four corners of the bottom part 54 on the outer side of the cylindrical part 53 of the metal cap 50 so as to protrude from the rear surface of the bottom part of the metal cap 50. The protrusion parts 58 are formed in such a manner as to be arranged in a region narrower than the inner region of the metal ring 32. Accordingly, when the metal cap 50 is provided on the package 10 with all the protrusion parts 58 positioned on the inner side of the metal ring 32, the metal ring 32 and the metal cap 50 can be easily aligned with each other. The convex part 58 can be easily formed at the time of manufacturing the metal cap 50 by press working.

Note that details of the surface emitting laser module other than the above are the same as those of the first embodiment.

Fifth Embodiment

Figure 10A:
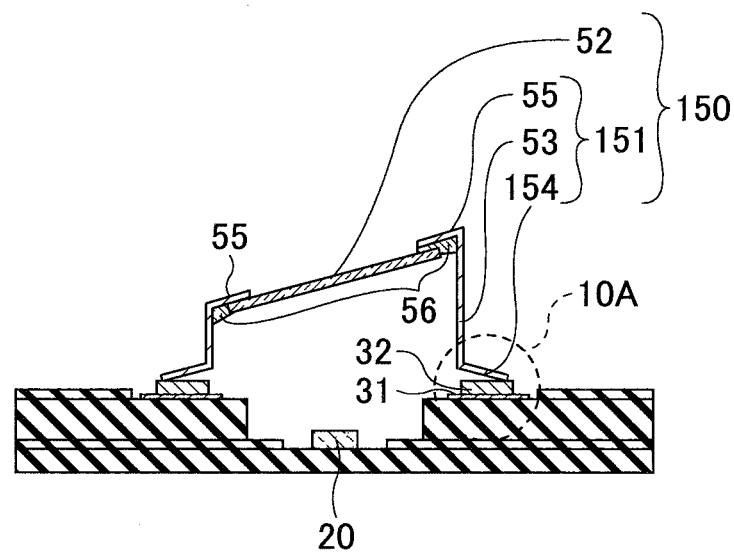
FIGS. 10A through 10C are views showing the structure of the surface emitting laser module according to a fifth embodiment.
Figure 10B:
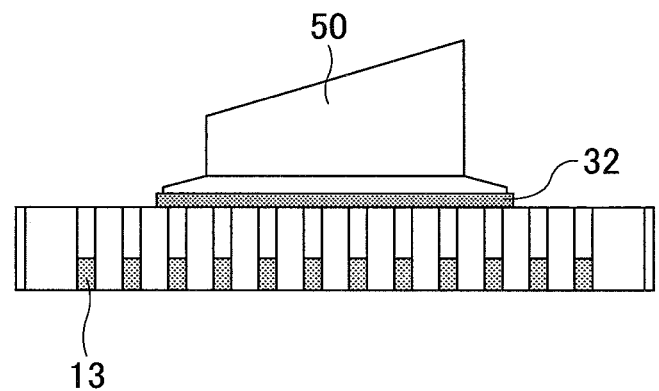
Figure 10C:
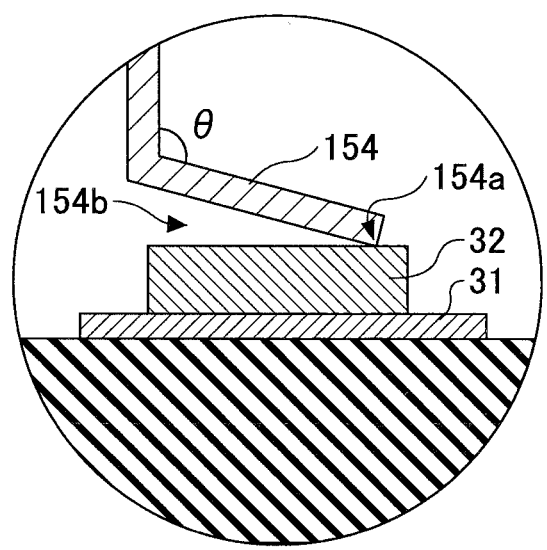

Next, a fifth embodiment is described. FIGS. 10A through 10C show the surface emitting laser module in which a metal cap is attached to a package, i.e., the surface emitting laser module according to this embodiment, wherein FIG. 10A is a cross-sectional view, FIG. 10B is a side view, and FIG. 10C is an enlarged view of a region surrounded by broken line 10A of FIG. 10A.

The metal cap 150 used in this embodiment has a cap main body part 151 formed of metal and the window glass 52 that causes light to pass through. The cap main body part 151 has the cylindrical part 53, and the cylindrical part 53 has on one end a bottom part 154 folded to be connected to the metal ring 32. Further, the cylindrical part 53 has on the other side the inclination part 55 to enable the window glass 52 to be attached to the cap main body part 151 at a predetermine angle.

Further, the metal cap 150 according to this embodiment is formed not to be parallel to the surface of the metal ring 32 at the surface of the bottom part 154 but folded to be brought into contact with the metal ring 32 at its peripheral part 154a on the outer side of the bottom part 154 when the metal cap 150 is mounted on the metal ring 32. In other words, the metal cap 150 is formed such that an angle θ formed by the surface of the cylindrical part 53 and the surface of the bottom part 154 becomes an obtuse angle. Thus, a gap 154b is formed between the bottom part 154 of the metal cap 150 and the metal ring 32 inside the metal cap 150.

Meanwhile, regarding a metal cap formed to be parallel to the surface to the metal ring 32 at its surface of the bottom part when the metal cap is mounted on the metal ring 32, there is a likelihood of the bottom part of the metal cap being deformed due to a force applied at a manufacturing process and the uneven surface of the bottom part being generated due to a manufacturing error or the like. In this case, even when the metal ring 32 and the metal cap are bonded together by seam welding, a gap formed between the bottom part of the metal cap and the metal ring 32 cannot be filled. Therefore, it is not possible to manufacture a surface emitting laser module having sufficient air tightness.

As shown in FIGS. 10A through 10D, in this embodiment, the metal cap 150 is formed not to be parallel to the surface of the metal ring 32 at the surface of the bottom part 154 and formed to be brought into line contact with the metal ring 32 at the bottom part 154. Therefore, for example, when pressure is applied to the metal cap 150 from above, the bottom part 154 of the metal cap 150 is desirably deformed such that the bottom part 154 of the metal cap 150 and the metal ring 32 can be in close contact with each other. Following seam welding, the surface emitting laser module having high air tightness can be manufactured. Note that the seam welding is a method of welding the metal cap 150 and the metal ring 32 together in such a manner that current is fed between the metal cap 150 and the metal ring 32 to melt metal at a contact part between the bottom part 154 of the metal cap 150 and the metal ring 32. For this reason, it is preferable that the bottom part 154 of the metal cap 150 and the metal ring 32 be in close contact with each other before being subjected to the seam welding.

The metal cap 150 according to this embodiment can be used instead of the metal cap 50 according to the first embodiment and include the features of the metal caps according to the second through fourth embodiments. Note that details of the surface emitting laser module other than the above are the same as those of the first embodiment.

Sixth Embodiment

Next, a sixth embodiment is described. This embodiment is directed to a laser printer 1000 as an image forming apparatus using the surface emitting laser modules according to the first through fifth embodiments.

Figure 11:
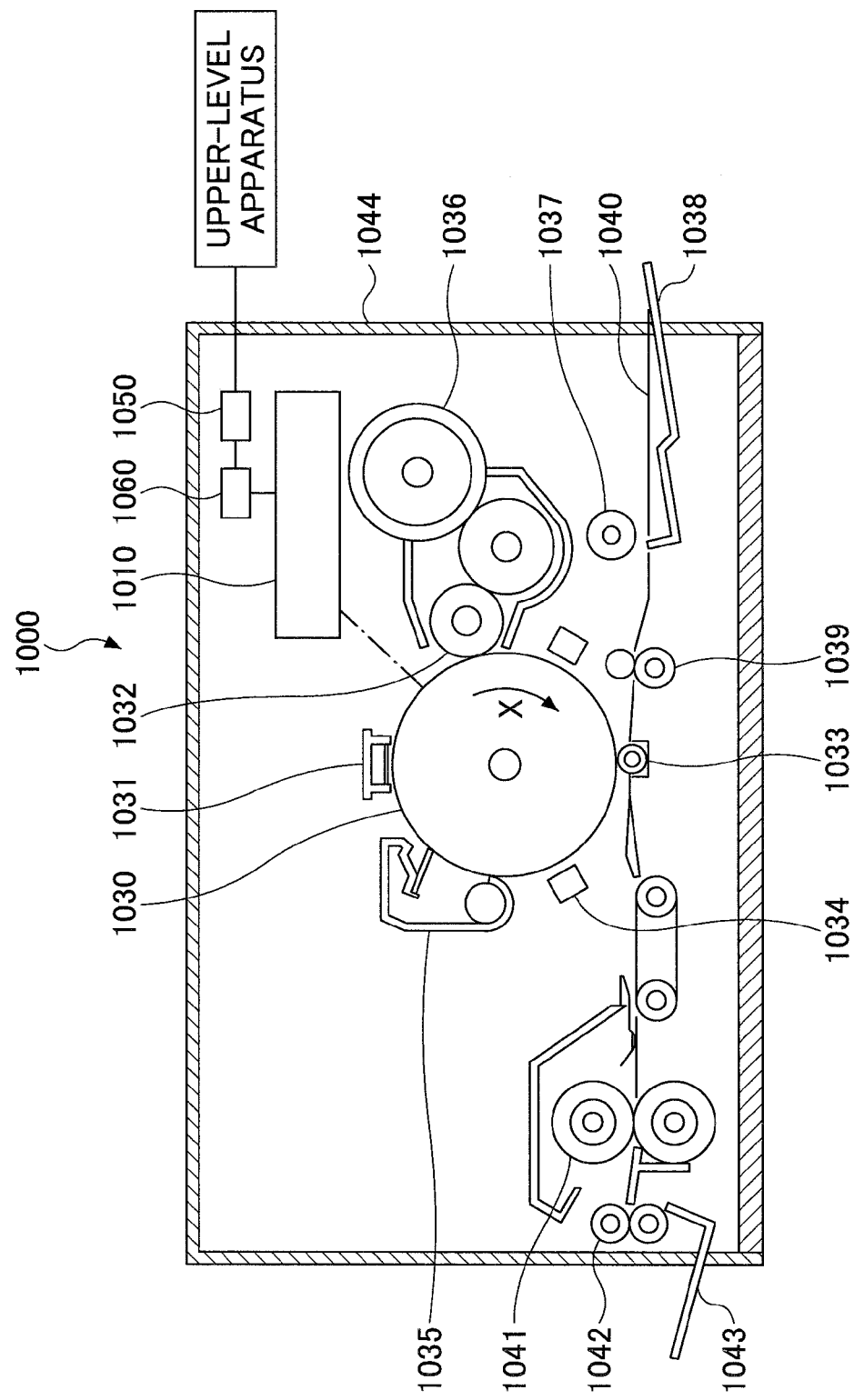
FIG. 11 is a view showing the configuration of a laser printer according to a sixth embodiment.

The laser printer 1000 according to this embodiment is described based on FIG. 11. The laser printer 1000 according to this embodiment has an optical scanner 1010, a photosensitive drum 1030, an electrifying charger 1031, a development roller 1032, a transfer charger 1033, an electricity removing unit 1034, a cleaning unit 1035, a toner cartridge 1036, a sheet feeding roller 1037, a sheet feeding tray 1038, a pair of resist rollers 1039, a fixing roller 1041, a sheet ejection roller 1042, a sheet ejection tray 1043, a communication control unit 1050, a printer control unit 1060 that collectively controls the above respective components, and the like. Note that these components are accommodated at predetermined positions in a printer housing 1044.

The communication control unit 1050 controls bidirectional communications with an upper level apparatus (e.g., a personal computer) via a network or the like.

The photosensitive drum 1030 is a cylinderical member and has a photosensitive layer at its front surface. That is, the front surface of the photosensitive drum 1030 serves as a surface to be scanned. The photosensitive drum 1030 rotates in a direction as indicated by arrow X.

The electrifying charger 1031, the development roller 1032, the transfer charger 1033, the electricity removing unit 1034, and the cleaning unit 1035 are each arranged near the front surface of the photosensitive drum 1030. At this time, they are arranged along the rotating direction of the photosensitive drum 1030 in the order of the electrifying charger 1031, the development roller 1032, the transfer charger 1033, the electricity removing unit 1034, and the cleaning unit 1035.

The electrifying charger 1031 uniformly charges the front surface of the photosensitive drum 1030.

The optical scanner 1010 scans the front surface of the photosensitive drum 1030 charged by the electrifying charger 1031 with a light flux modulated according to image information from the upper level apparatus, and forms a latent image corresponding to the image information on the front surface of the photosensitive drum 1030. The latent image thus formed moves to the development roller 1032 with the rotation of the photosensitive drum 1030. Note that the configuration of the optical scanner 1010 is described below.

A toner cartridge 1036 stores toner and supplies the toner to the development roller 1032.

The development roller 1032 attaches the toner supplied from the toner cartridge 1036 to the latent image formed on the front surface of the photosensitive drum 1030 to visualize the image information. Here, the latent image (hereinafter referred also to be a "toner image" for convenience sake) to which the toner is attached moves to the transfer charger 1033 with the rotation of the photosensitive drum 1030.

The sheet feeding tray 1038 stores recording sheets 1040. The sheet feeding roller 1037 is arranged near the sheet feeding tray 1038. The sheet feeding roller 1037 takes out the recording sheets 1040 one by one from the sheet feeding tray 1038 and conveys it to the pair of resist rollers 1039. The pair of resist rollers 1039 temporarily holds the recording sheet 1040 taken out by the sheet feeding roller 1037 and feeds it to a gap between the photosensitive drum 1030 and the transfer charger 1033 in synchronization with the rotation of the photosensitive drum 1030.

In order to attract the toner on the front surface of the photosensitive drum 1030 to the recording sheet 1040, voltage having polarity opposite to the toner is applied to the transfer charger 1033. With this voltage, the toner image on the front surface of the photosensitive drum 1030 is transferred onto the recording sheet 1040. The recording sheet 1040 onto which the toner image is transferred is fed to the fixing roller 1041.

The fixing roller 1041 applies heat and pressure onto the recording sheet 1040, whereby the toner is fixed onto the recording sheet 1040. The recording sheet 1040 thus fixed is fed to the sheet ejection tray 1043 via the sheet ejection roller 1042 to be successively stuck thereon.

The electricity removing unit 1034 removes electricity on the front surface of the photosensitive drum 1030.

The cleaning unit 1035 removes toner (remaining toner) remaining on the front surface of the photosensitive drum 1030. The front surface of the photosensitive drum 1030 from which the remaining toner is removed returns to a position opposed to the electrifying charger 1031 again.

Figure 12:
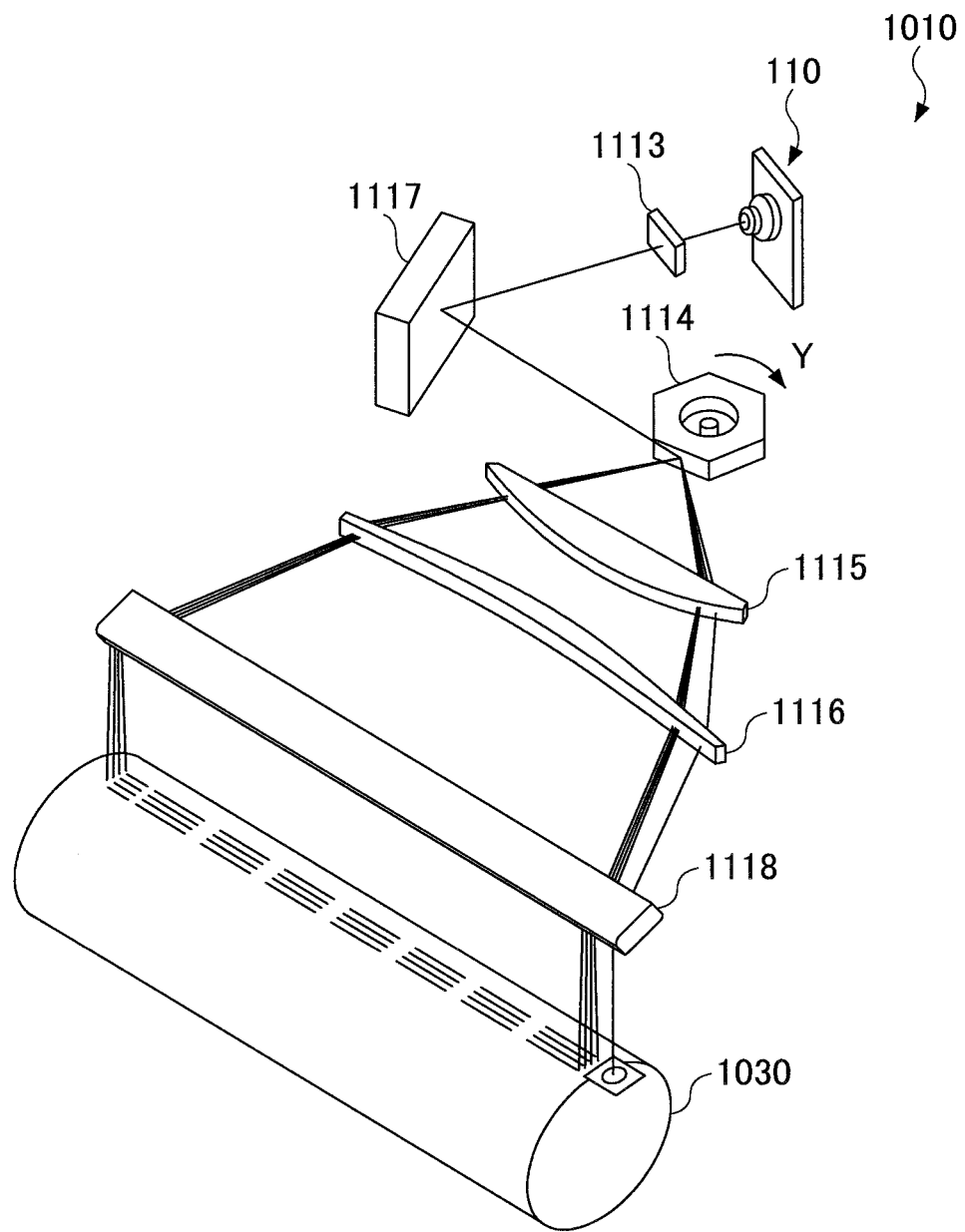
FIG. 12 is a view showing the configuration of an optical scanner according to the sixth embodiment.

Next, the optical scanner 1010 is described based on FIG. 12. The optical scanner 1010 has a light source unit 110, a coupling lens (not shown), an aperture plate (not shown), a cylindrical lens 1113, a polygon mirror 1114, an f-θ lens 1115, a toroidal lens 1116, two mirrors 1117 and 1118, and a control unit (not shown) that comprehensively controls the above respective components. Note that the light source unit 110 includes any one of the light emitting laser modules according to the first through fifth embodiments.

The cylindrical lens 1113 condenses light output from the light source unit 110 on a position near the deflecting and reflecting surface of the polygon mirror 1114 via the mirror 1117.

The polygon mirror 1114 is composed of a short hexagonal-column member and has six deflecting and reflecting surfaces at its side surface. A rotating mechanism (not shown) rotates the polygon mirror 1114 at a constant angle rate in a direction as indicated by arrow Y.

Accordingly, the light emitted from the light source unit 110 and condensed on the position near the deflecting and reflecting surface of the polygon mirror 1114 by the cylindrical lens 1113 is deflected at the constant angle rate with the rotation of the polygon mirror 1114.

The f-θ lens 1115 has an image height proportional to the angle of the light incident from the polygon mirror 1114 and moves the image surface of the light, which is deflected at the constant angle rate by the polygon mirror 1114, at a constant speed in a main scanning direction. The toroidal lens 1116 forms the light from the f-θ lens 1115 into an image on the front surface of the photosensitive drum 1030 via the mirror 1118.

The toroidal lens 1116 is arranged on the light path of the light flux via the f-θ lens 1115. The light flux via the toroidal lens 1116 is applied onto the front surface of the photosensitive drum 1030 to form a light spot. The light spot moves in the longitudinal direction of the photosensitive drum 1030 with the rotation of the polygon mirror 1114. That is, the light spot scans the photosensitive drum 1030. At this time, the moving direction of the light spot is the "main scanning direction." Further, the rotating direction of the photosensitive drum 1030 is a "sub-scanning direction."

Optical systems arranged on a light path between the polygon mirror 1114 and the photosensitive drum 1030 are also called scanning optical systems. In this embodiment, the optical scanning systems are composed of the f-θ lens 1115 and the toroidal lens 1116. Note that at least one return mirror may be arranged on at least one of a light path between the f-θ lens 1115 and the toroidal lens 1116 and a light path between the toroidal lens 1116 and the photosensitive drum 1030.

Figure 13:
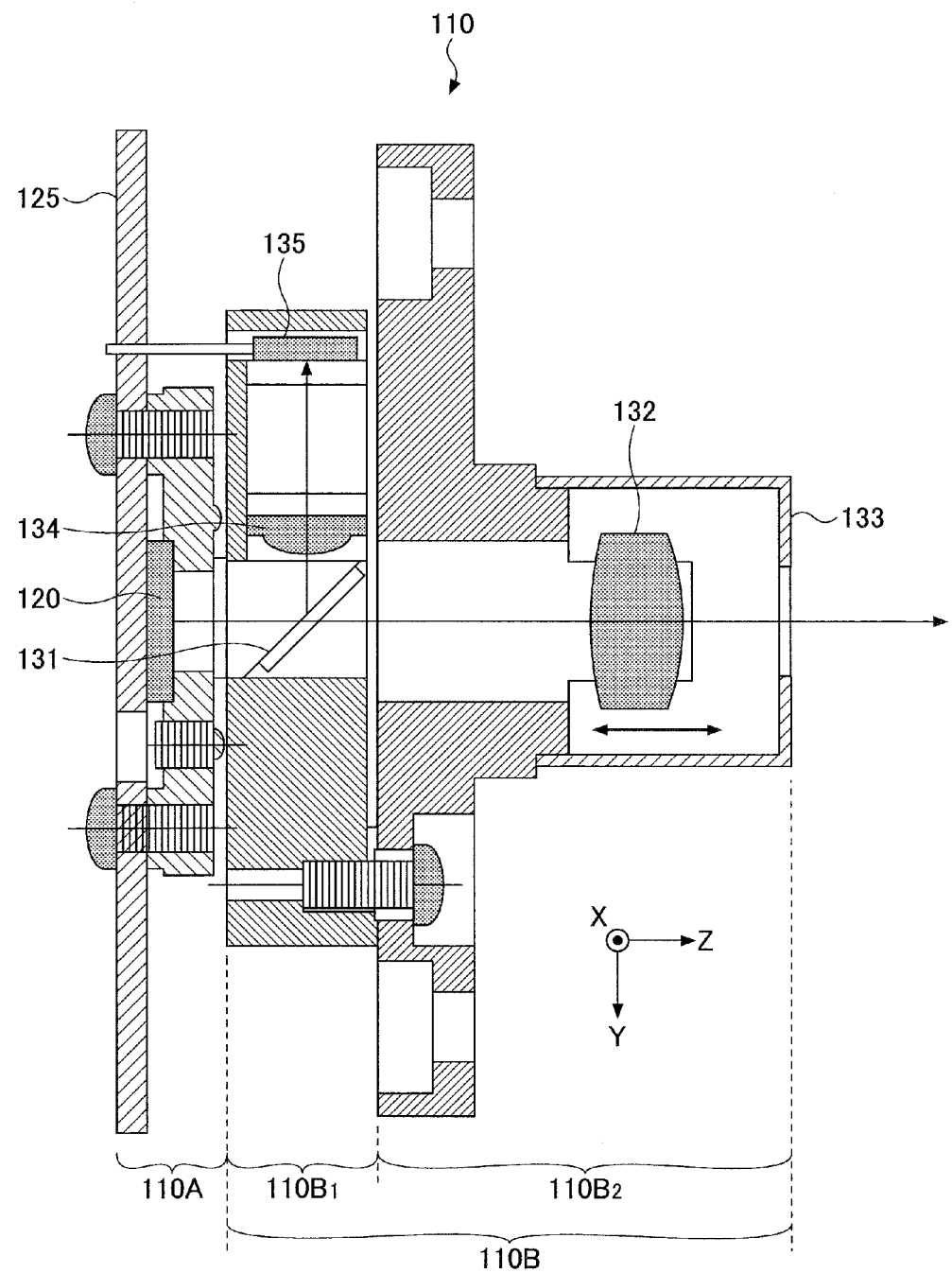
FIG. 13 is a view showing the configuration of the light source unit of the optical scanner according to the sixth embodiment.

Next, the light source unit 110 is described based on FIG. 13. The light source unit 110 is configured in such a manner that a laser module 110A including any one of the surface emitting laser modules according to the first through fifth embodiments and an optical module 110B are combined together.

Note that in this specification, the direction of light output from the light source unit 110 is described as a Z-axis direction, and two directions orthogonal to each other in a plane perpendicular to the Z-axis direction are described as an X-axis direction and a Y-axis direction, respectively. The laser module 110A has a surface emitting laser module 120 according to any one of the first through fifth embodiments, a laser control unit (not shown) that drives and controls a surface emitting laser element provided in the surface emitting laser module 120, and a PCB (Printed Circuit Board) 125 on which the surface emitting laser module 120 and the laser control unit are mounted.

Further, the optical module 1108 has a first part 110B$_1$ and a second part 110B$_2$. The first part 110B$_1$ has an aperture mirror 131, a condensing lens 134, and a light receiving element 135. The second part 110B$_2$ has a collimating lens 132 and an opening plate 133.

The first part 110B$_1$ is located in the positive Z-axis direction of the laser module 110A such that the aperture mirror 131 is arranged on the light path of the light emitted from the surface emitting laser array chip of the surface emitting laser module 120. Part of the light incident on the aperture mirror 131 is reflected in the negative Y-axis direction and received by the light receiving element 135 via the condensing lens 134. The light receiving element 135 outputs a signal (photoelectric conversion signal) corresponding to an amount of the received light to the laser control unit.

The second part 110B$_2$ is located in the positive Z-axis direction of the first part 110B$_1$ such that the collimating lens 132 is arranged on the light path of the light passing through the aperture mirror 131. The collimating lens 132 converts the light passing through the aperture mirror 131 into substantially parallel light. The opening plate 133 has an opening part and shapes the light converted by the collimating lens 132. Accordingly, the light passing through the opening part of the opening plate 133 is output from the light source unit 110. Thus, the light emitted from the surface emitting laser module 120 is directly incident on the optical module 110B.

Since the laser printer 1000 according to this embodiment uses the surface emitting laser module according to any one of the first through fifth embodiments, it can perform printing without reducing its print speed even if a writing dot density is increased. Further, the laser printer 1000 can further increase the print speed if the writing dot density is the same.

Further, in this case, since the deflecting direction of a light flux from each of the light emitting components is stably uniform, the laser printer 1000 can reliably form a high-quality image.

Note that this embodiment describes the laser printer 1000 as an image forming apparatus, but the image forming apparatus is not limited to the laser printer 1000.

For example, the image forming apparatus may be one that directly applies laser light to a medium (such as a sheet) that colors with the application of the laser light.

Further, the image forming apparatus may be one that uses a silver halide film as an image carrier. In this case, a latent image is formed on the silver halide film by optical scanning and can be visualized in a process similar to development in a normal silver halide photography process. Then, the latent image can be transferred onto a print sheet in a process similar to printing in the normal silver halide photography process. Such an image forming apparatus can be implemented as an optical plate-making apparatus and an optical drawing apparatus that draws a CT scan image or the like.

Seventh Embodiment

Next, a seventh embodiment is described. The seventh embodiment is directed to a color printer 2000 having plural photosensitive drums.

Figure 14:
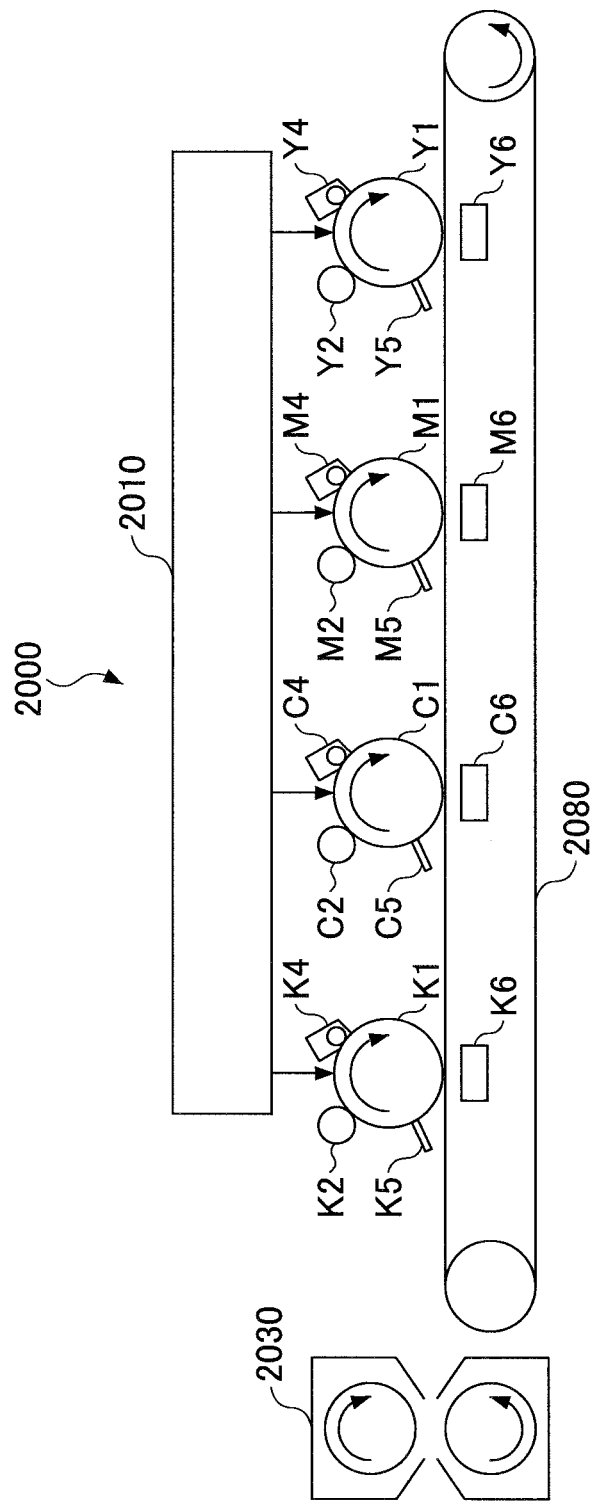
FIG. 14 is a view showing the configuration of a color printer according to a seventh embodiment.

The color printer 2000 according to this embodiment is described based on FIG. 14. The color printer 2000 according to this embodiment is a tandem multi-color printer that overlaps four colors (black, cyan, magenta, and yellow) with each other to form a full-color image. The color printer 2000 has a photosensitive drum K1, a charging unit K2, a development unit K4, a cleaning unit K5, and a transfer unit K6 for the color black; a photosensitive drum C1, a charging unit C2, a development unit C4, a cleaning unit C5, and a transfer unit C6 for the color cyan; a photosensitive drum M1, a charging unit M2, a development unit M4, a cleaning unit M5, and a transfer unit M6 for the color magenta; a photosensitive drum Y1, a charging unit Y2, a development unit Y4, a cleaning unit Y5, and a transfer unit Y6 for the color yellow; an optical scanner 2010; a transfer belt 2080; a fixing unit 2030; and the like.

Each of the photosensitive drums K1, C1, M1, and Y1 rotates in a direction as indicated by an arrow shown in FIG. 14 and has at its periphery the charging unit, the development unit, the transfer unit, and the cleaning unit in this order along the rotating direction. Each of the charging units K2, C2, M2, and Y2 uniformly charges the front surface of the corresponding one of the photosenstive drums K1, C1, M1, and Y1. The optical scanner 2010 applies light to the front surfaces of the photosensitive drums K1, C1, M1, and Y1 charged by the charging units K2, C2, M2, and Y2 to form latent images on the photosensitive drums K1, C1, M1, and Y1. Then, the development units K4, C4, M4, and Y4 form toner images on the front surfaces of the photosensitive drums K1, C1, M1, and Y1, respectively. Moreover, the transfer units K6, C6, M6, and Y6 transfer the toner images of the respective colors onto a recording sheet on the transfer belt 2080. Finally, the fixing unit 2030 fixes the images onto the recording sheet.

The optical scanner 2010 has the light source units including any one of the light emitting laser modules according to the first through fifth embodiments for the respective colors. Therefore, the optical scanner 2010 can obtain the same effects as those of the optical scanner 1010 according to the sixth embodiment. Further, the color printer 2000 can obtain the same results as those of the laser printer 1000 according to the sixth embodiment.

Meanwhile, in the color printer 2000, color shifts may occur due to manufacturing errors, positioning errors, or the like of components. Even in this case, since the respective light sources of the optical scanner 2010 have the light source unit including any one of the surface emitting laser modules according to the first through fifth embodiments, the color printer 2000 can reduce the color shifts by selecting a light emitting part to be lit.

Accordingly, since the color printer 2000 according to this embodiment has any one of the surface emitting laser modules according to the first through fifth embodiments, it can form a high-quality and reliable image.

The present invention is not limited to the specifically disclosed embodiments, and variations and modifications may be made without departing from the scope of the present invention.

The present application is based on Japanese Priority Application Nos. 2010-061648 filed on Mar. 17, 2010, and 2011-000775 filed on Jan. 5, 2011, the entire contents of which are hereby incorporated herein by reference.

What is claimed is:

1. A surface emitting laser module comprising:
   a surface emitting laser element formed in a semiconductor substrate and having a surface emitting laser array configured to emit multiple light beams in a direction perpendicular to a surface of the semiconductor substrate;
   a package having a bonding surface and a region in which the semiconductor substrate is provided;
   a plurality of connection terminals disposed at a periphery of the package;
   a metal ring part disposed on the bonding surface of the package in which the surface emitting laser element is disposed; and
   a metal cap having a cylindrical part formed of metal, the cylindrical part having a transparent substrate disposed on one side thereof and a bottom part disposed on the other side thereof being bonded to the metal ring part which is disposed on the bonding surface of the package; wherein
   an outer diagonal of the bottom part is greater than an outer diameter of the cylindrical part, and an outer diagonal of the metal ring part is greater than the outer diagonal of the bottom part,
   the transparent substrate is provided in the metal cap and disposed to be inclined at a predetermined angle greater than zero with respect to the semiconductor substrate so that portions of the light beams emitted from the surface emitting laser array which reflect from the transparent substrate do not return to the laser emitting laser array,
   the metal cap is disposed on an upper surface of the metal ring part, and
   the metal cap and the upper surface of the metal ring part are bonded together by welding, and wherein
   the package includes
      a concave part,
      a mount part disposed on a bottom surface of the concave part to mount the semiconductor substrate thereon, and
      a plurality of lead terminals disposed around a periphery of the mount part and inside the concave part and extending radially from said periphery of the mount part, and wherein
   at least some of the lead terminals of the package are electrically connected to the surface emitting laser array, and
   the connection terminals disposed at the periphery of the package are electrically connected to the lead terminals disposed inside the concave part of the package, to connect the surface emitting laser array through multiple channels to signal sources, external to the surface emitting laser module, that control the multiple light beams to be emitted by the surface emitting laser array.

2. The surface emitting laser module according to claim 1, wherein the metal ring part has a structure in which a plating part formed by plating and a metal ring are bonded together.

3. The surface emitting laser module according to claim 2, wherein the plating part is electrically connected to a region of underlaying metal and a plating wiring extending from a side surface of the package.

4. The surface emitting laser module according to claim 2, wherein the concave part has a step part lower than an uppermost surface of the package at a periphery thereof, and the plating part is provided on the step part.

5. The surface emitting laser module according to claim 4, wherein the metal ring has a thickness greater than a step height between the uppermost surface and the step part.

6. The surface emitting laser module according to claim 4, wherein the bottom part has an outer shape smaller than an outer shape of the metal ring.

7. The surface emitting laser module according to claim 4, wherein the bottom part has, on a surface thereof connected to the package, plural protrusion parts or convex parts arranged in a region narrower than an inner region of the metal ring.

8. The surface emitting laser module according to claim 1, wherein the bottom part has a first bottom part on an outer side thereof and a second bottom part on a side inner than the first bottom part, the second bottom part having a thickness greater than a thickness of the first bottom part.

9. The surface emitting laser module according to claim 1, wherein a surface of the metal ring part is not parallel to the bottom part of the metal cap when the metal cap is mounted on the metal ring part.

10. The surface emitting laser module according to claim 1, wherein the welding comprises seam welding.

11. An optical scanner that scans a surface to be scanned with light, the optical scanner comprising:
 a light source having the surface emitting laser module according to claim 1;
 a light deflecting part that deflects the light from the light source; and
 a scanning optical system that condenses the light deflected by the light deflecting part on the surface to be scanned.

12. An image forming apparatus comprising: an image carrier; and the optical scanner according to claim 11 that scans the image carrier with light modulated based on image information.

13. The image forming apparatus according to claim 12, wherein
 the image carrier comprises plural image carriers, and
 the image information comprises multi-color information.

14. The surface emitting laser module according to claim 1, wherein the bonding surface of the package and the upper surface of the metal ring part are parallel to each other.

15. The surface emitting laser module according to claim 1, wherein the metal cap is disposed above the bonding surface of the package and is disposed above the upper surface of the metal ring part.

16. The surface emitting laser module according to claim 1, wherein the bottom part of the metal cap has a length F smaller than a length G of the metal ring part, and a difference between the length F of the bottom part of the metal cap and the length G of the metal ring part is approximately twice a thickness H of the bottom part of the metal cap.

17. A surface emitting laser module comprising:
 a surface emitting laser element formed in a semiconductor substrate and having a surface emitting laser array configured to emit multiple light beams in a direction perpendicular to a surface of the semiconductor substrate;
 a package having a bonding surface and a region in which the semiconductor substrate is provided;
 a metal ring part disposed on the bonding surface of the package in which the surface emitting laser element is disposed;
 a plurality of connection terminals disposed at a periphery of the package; and
 a metal cap having a cylindrical part, an inclination part coupled on one side of the cylindrical part, and a bottom part on the other side of the cylindrical part and bonded to the metal ring part disposed on the bonding surface of the package, each of the inclination part, the bottom part and cylindrical part being formed of metal; and
 a transparent substrate fixed to the inclination part, wherein
 an outer diagonal of the bottom part is greater than an outer diameter of the cylindrical part, and an outer diagonal of the metal ring part is greater than the outer diagonal of the bottom part,
 each of the transparent substrate and the inclination part is inclined at a predetermined angle greater than zero with respect to the semiconductor substrate so that portions of the light beams emitted from the surface emitting laser array which reflect from the transparent substrate do not return to the laser emitting laser array, and wherein
 the package includes
  a concave part,
  a mount part disposed on a bottom surface of the concave part to mount the semiconductor substrate thereon, and
  a plurality of lead terminals disposed around a periphery of the mount part and inside the concave part and extending radially from said periphery of the mount part, and, wherein
 at least some of the lead terminals are electrically connected to the surface emitting laser array, and
 the connection terminals disposed at the periphery of the package are electrically connected to the lead terminals disposed inside the concave part of the package, to connect the surface emitting laser array through multiple channels to signal sources, external to the surface emitting laser module, that control the multiple light beams to be emitted by the surface emitting laser array.

\* \* \* \* \*